United States Patent
Yamane et al.

(10) Patent No.: US 11,574,758 B2
(45) Date of Patent: Feb. 7, 2023

(54) MAGNETIC FIELD SENSOR USING DIFFERENT MAGNETIC TUNNELING JUNCTION (MTJ) STRUCTURES

(71) Applicant: GLOBALFOUNDRIES Singapore Pte. Ltd., Singapore (SG)

(72) Inventors: Kazutaka Yamane, Singapore (SG); Eng-Huat Toh, Singapore (SG); Vinayak Bharat Naik, Singapore (SG); Hemant M. Dixit, Halfmoon, NY (US)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 28 days.

(21) Appl. No.: 17/314,754

(22) Filed: May 7, 2021

(65) Prior Publication Data
US 2022/0359114 A1    Nov. 10, 2022

(51) Int. Cl.
*G01R 33/00* (2006.01)
*H01F 10/32* (2006.01)
*G01R 33/09* (2006.01)

(52) U.S. Cl.
CPC ..... *H01F 10/3272* (2013.01); *G01R 33/0052* (2013.01); *G01R 33/098* (2013.01); *H01F 10/3254* (2013.01)

(58) Field of Classification Search
CPC ............ H01F 10/3272; G01R 33/0052; G01R 33/098
See application file for complete search history.

(56) References Cited

U.S. PATENT DOCUMENTS

| | | | | |
|---|---|---|---|---|
| 2003/0214762 A1* | 11/2003 | Sharma | .................. | B82Y 25/00 360/316 |
| 2006/0267056 A1* | 11/2006 | Ju | .......................... | H01L 27/222 257/E27.005 |
| 2008/0278994 A1* | 11/2008 | Katti | ................... | G11C 11/5607 365/158 |
| 2011/0074406 A1* | 3/2011 | Mather | ................ | G01R 33/093 324/252 |

(Continued)

FOREIGN PATENT DOCUMENTS

WO    WO-2019005160 A1 *   1/2019

OTHER PUBLICATIONS

Ferreira, R. et al., "2-Axis Magnetometers Based on Full Wheatstone Bridges Incorporating Magnetic Tunnel Junctions Connected in Series", IEEE Trans. On Magnetics, Nov. 2012, vol. 48, No. 11, 4 pages.

(Continued)

*Primary Examiner* — Alvaro E Fortich
(74) *Attorney, Agent, or Firm* — David Cain; Andrew M. Calderon; Calderon Safran & Cole, P.C.

(57) ABSTRACT

The present disclosure relates to integrated circuits, and more particularly, to a highly sensitive tunnel magnetoresistance sensor (TMR) with a Wheatstone bridge for field/position detection in integrated circuits and methods of manufacture and operation. In particular, the present disclosure relates to a structure including: a first magnetic tunneling junction (MTJ) structure on a first device level; and a second magnetic tunneling junction (MTJ) structure on a different device level than the first MTJ structure. The second MTJ structure includes properties different than the first MTJ structure.

20 Claims, 4 Drawing Sheets

(56) References Cited

U.S. PATENT DOCUMENTS

2013/0169271 A1* 7/2013 Nordman ............. G01R 33/098
                                                                  324/222

OTHER PUBLICATIONS

Ogasawara, T. et al., "Effect of second-order magnetic anisotropy on nonlinearity of conductance in CoFeB/MgO/CoFeB magnetic tunnel junction for magnetic sensor devices", Scientific Reports, Nature, Sep. 2019, 9 pages.
Jeng, J. et al., "Vector Magnetometer with Dual-Bridge GMR Sensors", IEEE Trans. on Magnetics, Jan. 2014, vol. 50, No. 1, 2 pages.
Nakano, T. et al., "Magnetic Tunnel Junctions With [Co/Pd]-Based Reference Layer and CoFeB Sensing Layer for Magnetic Sensor", IEEE Trans. on Magnetics, Jul. 2016, vol. 52, No. 7, 4 pages.
Franco, F. et al., "Reconfigurable Spintronics Wheatstone Bridge Sensors With Offset Voltage Compensation at Wafer Level", IEEE Trans. on Magnetics, Jul. 2019, vol. 55, No. 7, 5 pages.

\* cited by examiner

MAGNETIC FIELD SENSOR USING DIFFERENT MAGNETIC TUNNELING JUNCTION (MTJ) STRUCTURES

FIELD OF THE INVENTION

The present disclosure relates to integrated circuits, and more particularly, to a magnetic field sensor using different magnetic tunneling junction (MTJ) structures and methods of manufacture and operation.

BACKGROUND

In magnetic sensor technology, a Hall sensor can produce a Hall effect on a semiconductor. In particular, the Hall sensor is a device which can measure a magnitude of a magnetic field. An output voltage of the Hall sensor is directly proportional to a magnetic field strength and can be used for proximity sensing, positioning, speed detection, and current sensing applications. Anisotropic magneto-resistance (AMR) sensors measure changes in an angle of a magnetic field by using iron material. The resistance of the iron material in the AMR sensors depends on a direction of current flow and direction of magnetization. The AMR sensors can determine non-contact position measurements in harsh environments.

Giant magneto-resistance (GMR) sensors use quantum mechanics effects with a non-magnet material between two iron material layers. Therefore, the GMR sensors result in high resistance for anti-parallel spin alignment and low resistance for parallel spin alignment when a current passes through one of the two iron material layers. In comparison to the above type of sensors, tunnel magnetoresistance (TMR) sensors have magnetic tunneling junction (MTJ) elements which have resistance changes with a parallel alignment or an anti-parallel alignment.

SUMMARY

In an aspect of the disclosure, a structure comprises: a first magnetic tunneling junction (MTJ) structure on a first device level; and a second magnetic tunneling junction (MTJ) structure on a different device level than the first MTJ structure. The second MTJ structure includes properties different than the first MTJ structure.

In another aspect of the disclosure, a structure comprises: a first magnetic tunneling junction (MTJ) structure which includes a first layer synthetic anti ferromagnetic (SAF) on a first device level; and a second magnetic tunneling junction (MTJ) structure which includes a second layer synthetic anti ferromagnetic (SAF) on a second device level.

In another aspect of the disclosure, a method comprises: forming a first magnetic tunneling junction (MTJ) on a first device level; and forming a second magnetic tunneling junction (MTJ) on a different device level than the first MTJ, and the second MTJ is laterally and vertically offset from the first MTJ.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to integrated circuits, and more particularly, to a magnetic field sensor using different magnetic tunneling junction (MTJ) structures and methods of manufacture. More specifically, the present disclosure relates to a highly sensitive tunnel magnetoresistance sensor (TMR) which forms a Wheatstone bridge for field/position detection in integrated circuits. In embodiments, the TMR sensors comprise two different magnetic tunneling junction (MTJ) structures which are located on different levels of the integrated circuit. In embodiments, the two different sensing elements (e.g., MJT structures) have an opposite response in electrical resistance to a magnetic field. Advantageously, the structures described herein avoid topography and etch challenges that would occur with MTJ structures provided in a single metal layer by eliminating unwanted multiple sidewalls.

The devices of the present disclosure can be manufactured in a number of ways using a number of different tools. In general, though, the methodologies and tools are used to form structures with dimensions in the micrometer and nanometer scale. The methodologies, i.e., technologies, employed to manufacture the devices of the present disclosure have been adopted from integrated circuit (IC) technology. For example, the structures are built on wafers and are realized in films of material patterned by photolithographic processes on the top of a wafer. In particular, the fabrication of the devices uses three basic building blocks: (i) deposition of thin films of material on a substrate, (ii) applying a patterned mask on top of the films by photolithographic imaging, and (iii) etching the films selectively to the mask.

Figure 1A:
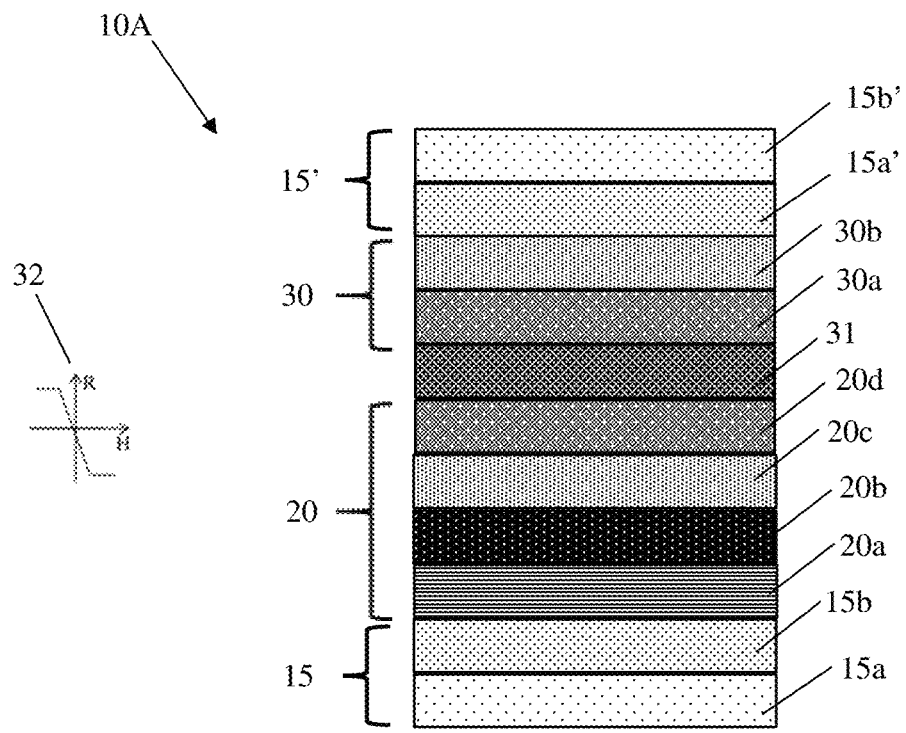
FIG. 1A shows a first magnetic tunneling junction (MTJ) structure and respective fabrication processes in accordance with aspects of the present disclosure.

FIG. 1A shows a first magnetic tunneling junction (MTJ) structure in accordance with aspects of the present disclosure. In FIG. 1A, the MTJ structure 10A includes contacts 15, 15', a bi-layer of ferromagnetic material 20, and a sensing layer 30. The bi-layer of ferromagnetic material 20 comprises a synthetic anti-ferromagnetic (SAF) stack of materials between the contact 15 and material 31; whereas, the sensing layer 30 is between the material 31 and the contact 15'. The material 31 comprises Magnesium Oxide (MgO); although other materials are also contemplated.

The contact 15 of the MTJ element 10A includes material 15b on top of and in direct contact with material 15a. Similarly, the contact 15' includes material 15b' on top of and in direct contact with material 15a'. In embodiments, materials 15a, 15a' comprise tantalum (Ta) and materials 15b, 15b' comprise Ruthenium (Ru); although other materials are also contemplated.

The bilayer of ferromagnetic material stack 20 includes materials 20a, 20b, 20c, and 20d, stacked in sequential order directly on top of and in contact with one another. In embodiments, for example, material 20a comprises Platinum Manganese (PtMn), material 20b comprises Cobalt Iron (CoFe), material 20c comprises Ruthenium (Ru), and material 20d comprises Cobalt Iron Boron Tantalum (CoFeBTa); although other materials are also contemplated herein. In particular, the material 20d can include any combination of Cobalt Iron, Cobalt Iron Boron, Tantalum, Molybdenum, Tungsten, Titanium, Zirconium, Hafnium, and Chromium. The bilayer of the ferromagnetic material stack 20 refers to materials 20b and 20d, which can be magnetized under a magnetic field.

The sensing layer 30 includes material 30b on top of and in direct contact with material 30a. Further, the material 30a is on top of and in direct contact with the material 31. In embodiments, the material 30a comprises Cobalt Iron Boron Tantalum (CoFeBTa) and the material 30b comprises Nickel Iron (NiFe); although other materials are also contemplated herein. In addition, any combination of Tantalum, Molybdenum, Tungsten, Titanium, Zirconium, Hafnium, and Chromium can be included between the material 30a and the material 30b. The material 30a can also include any combination of Tantalum, Molybdenum, Tungsten, Titanium, Zirconium, Hafnium, and Chromium.

Figure 1B:
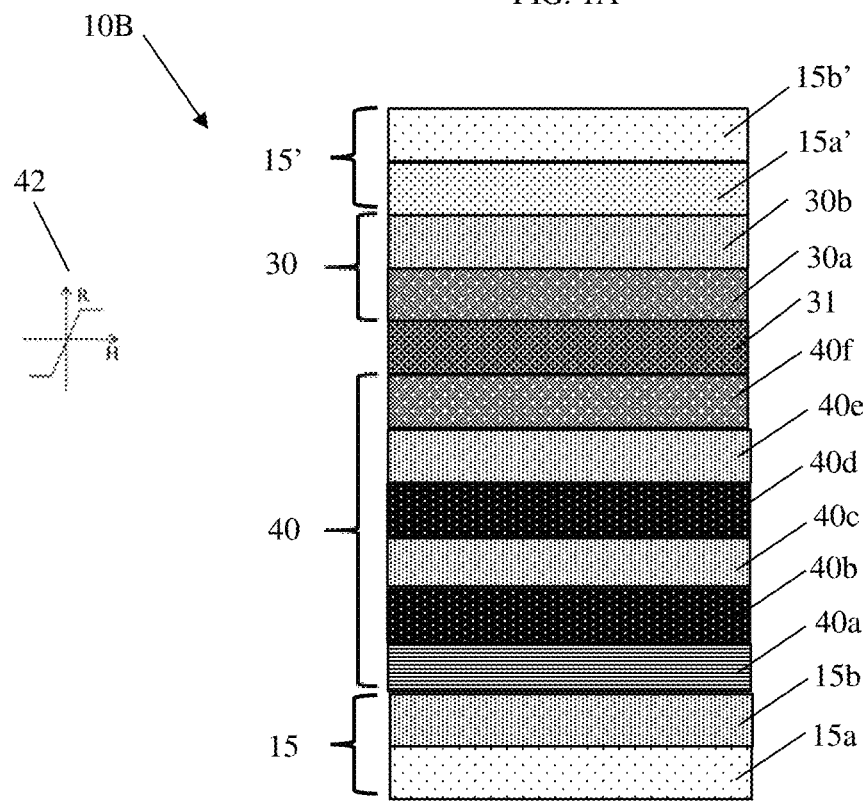
FIG. 1B shows a second magnetic tunneling junction (MTJ) structure and respective fabrication processes in accordance with aspects of the present disclosure.

FIG. 1B shows another magnetic tunneling junction (MTJ) structure 10B in accordance with aspects of the present disclosure. The MTJ structure 10B includes contacts 15, 15', a sensing layer 30, and a tri-layer ferromagnetic stack 40. The contact 15 of the MTJ element 10B includes material 15b on top of and in direct contact with material 15a. Further, the contact 15' includes material 15b' on top of an in direct contact with material 15a'. In embodiments, materials 15a, 15a' comprise tantalum (Ta) and material 15b, 15b' comprise Ruthenium (Ru); although other materials are also contemplated herein.

The tri-layer ferromagnetic stack 40 comprises a synthetic anti-ferromagnetic (SAF) stack of materials located between the contact 15 and material 31. The sensing layer 30 is between the material 31 and the contact 15'. The material 31 can include Magnesium Oxide (MgO); although other materials are also contemplated.

The tri-layer SAF stack 40 includes layers of materials 40a, 40b, 40c, 40d, 40e, and 40f, stacked in sequential order directly on top and in contact with one another. In embodiments, for example, material 40a comprises Platinum Manganese (PtMn), material 40b comprises Cobalt Iron (CoFe), material 40c comprises Ruthenium (Ru), material 40d comprises Cobalt Iron (CoFe), material 40e comprises Ruthenium (Ru), and material 40f comprises Cobalt Iron Boron Tantalum (CoFeBTa); although other materials are also contemplated. The tri-layer of the ferromagnetic stack 40 refers to materials 40b, 40d, and 40f, which can be magnetized under a magnetic field. Further, the material 40d can also comprise Cobalt Iron Boron (CoFeB) or a multilayer of Cobalt Iron (CoFe) and Cobalt Iron Boron (CoFeB). The material 40f can also include any combination of Cobalt Iron, Cobalt Iron Boron, Tantalum, Molybdenum, Tungsten, Titanium, Zirconium, Hafnium, and Chromium.

The sensing layer 30 includes material 30b on top of and in direct contact with material 30a. In embodiments, the material 30a comprises Cobalt Iron Boron Tantalum (CoFeBTa) and the material 30b comprises Nickel Iron (NiFe); although other materials are also contemplated herein. In addition, any combination of Tantalum, Molybdenum, Tungsten, Titanium, Zirconium, Hafnium, and Chromium can be included between the material 30a and the material 30b. The material 30a can also include any combination of Tantalum, Molybdenum, Tungsten, Titanium, Zirconium, Hafnium, and Chromium. Further, the layer 30a is on top of and in direct contact with the layer 31.

Characteristic graphs 32, 42 are also shown in FIGS. 1A and 1B. The characteristic graph 32 of the MTJ element 10A shows that the electrical resistance R decreases (i.e., electrical resistance R in the Y-axis) as the magnetic field H increases (i.e., magnetic field H in the X-axis). In comparison, the characteristic graph 42 of the MTJ structure 10B shows that the electrical resistance R increases (i.e., electrical resistance R in the Y-axis) as the magnetic field H increases (i.e., magnetic field H in the X-axis).

The MTJ structures 10A and 10B shown in FIGS. 1A and 1B can be formed by conventional deposition, lithography, and etching methods known to those of skill in the art. For example, each of the layers of material in each of the structures 10A, 10B can be deposited by a conventional deposition method such as a physical vapor deposition (PVD) and a chemical vapor deposition (CVD) process. As described herein, the materials for structure 10A can be deposited on a different level of the structure than the materials for structure 10B and, as such, the processes for forming the materials of the different MJT structures 10A, 10B can be performed at different stages within the fabrication processes. Following the deposition processes, a resist formed over a topmost material, e.g., layer 15b' is exposed to energy (light) to form a pattern (opening). An etching process with a selective chemistry, e.g., reactive ion etching (RIE), will be used to pattern the materials through the openings of the resist to form the respective MTJ structures 10A, 10B. The resist can be removed by a conventional oxygen ashing process or other known stripants.

Figure 2A:
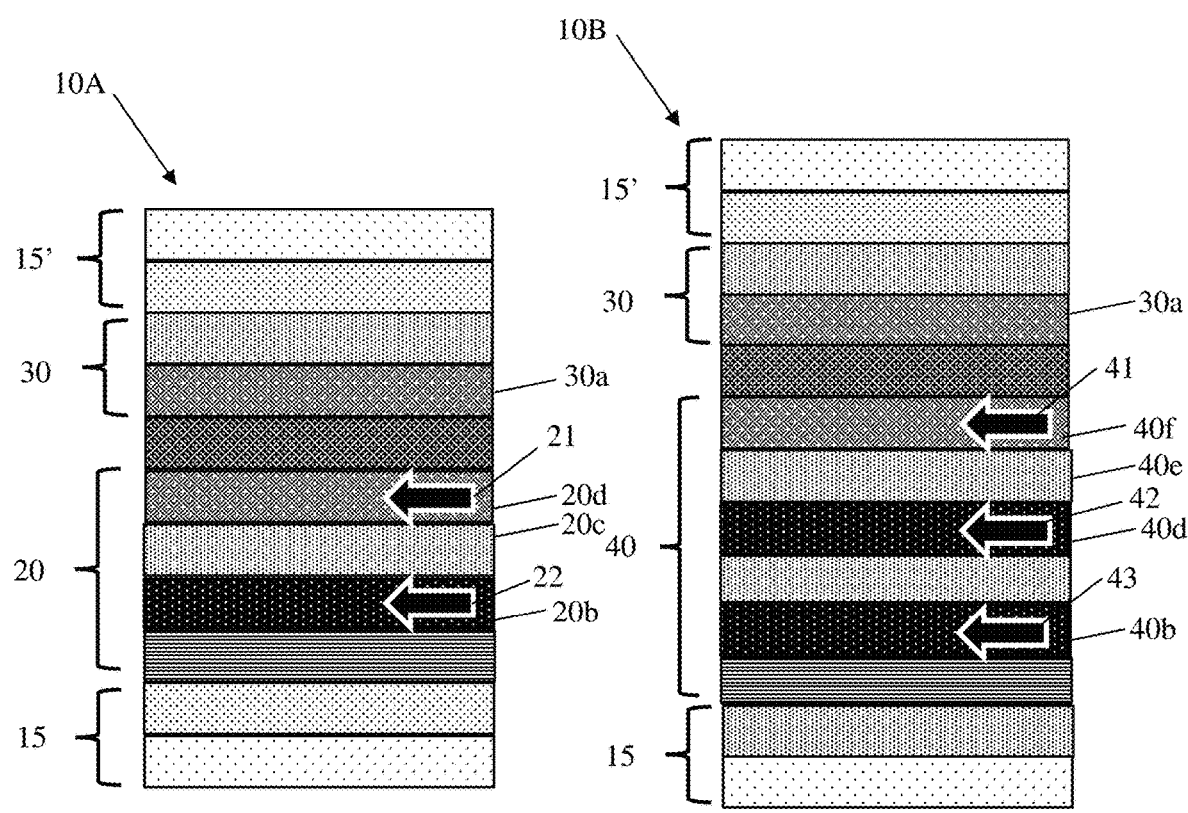
FIG. 2A shows a magnetization of certain materials of the first and second MTJ structures during an annealing process and being subjected to a magnetic field.

FIG. 2A representatively shows the magnetization of certain materials of the MTJ structures 10A, 10B while subjected to an annealing process and a magnetic field. In comparison, FIG. 2B representatively shows a different magnetization of certain materials of the MTJ structures 10A, 10B subsequent to the annealing process and when the magnetic field is turned off.

In particular, in FIG. 2A the MTJ structures 10A, 10B are shown under an annealing process and subjected to a magnetic field (i.e., 1-2 Tesla). In embodiments, the annealing process can be in a range of about 250° C.-400° C. for 1-4 hours; although other annealing temperatures and times are also contemplated. The annealing process under the magnetic field causes magnetization of layers 20b and 20d in the bilayer SAF 20 of the MTJ element 10A to be in a single direction as represented by arrows 22, 21, respectively. Further, the magnetization of the layer 20b can be fixed due to the anti-ferromagnetic (AFM)/ferromagnetic (FM) coupling between the layers 20b, 20a. Similarly, the annealing process under the magnetic field causes magnetization of layers 40b, 40d, and 40f in the tri-layer SAF 40 of the MTJ element 10B to be in a single direction as represented by arrows 41, 42, 43, respectively. Similar to MTJ structure 10A, the magnetization of the layer 40b can be fixed due to the anti-ferromagnetic (AFM)/ferromagnetic (FM) coupling between the layer 40b and layer 40a.

Figure 2B:
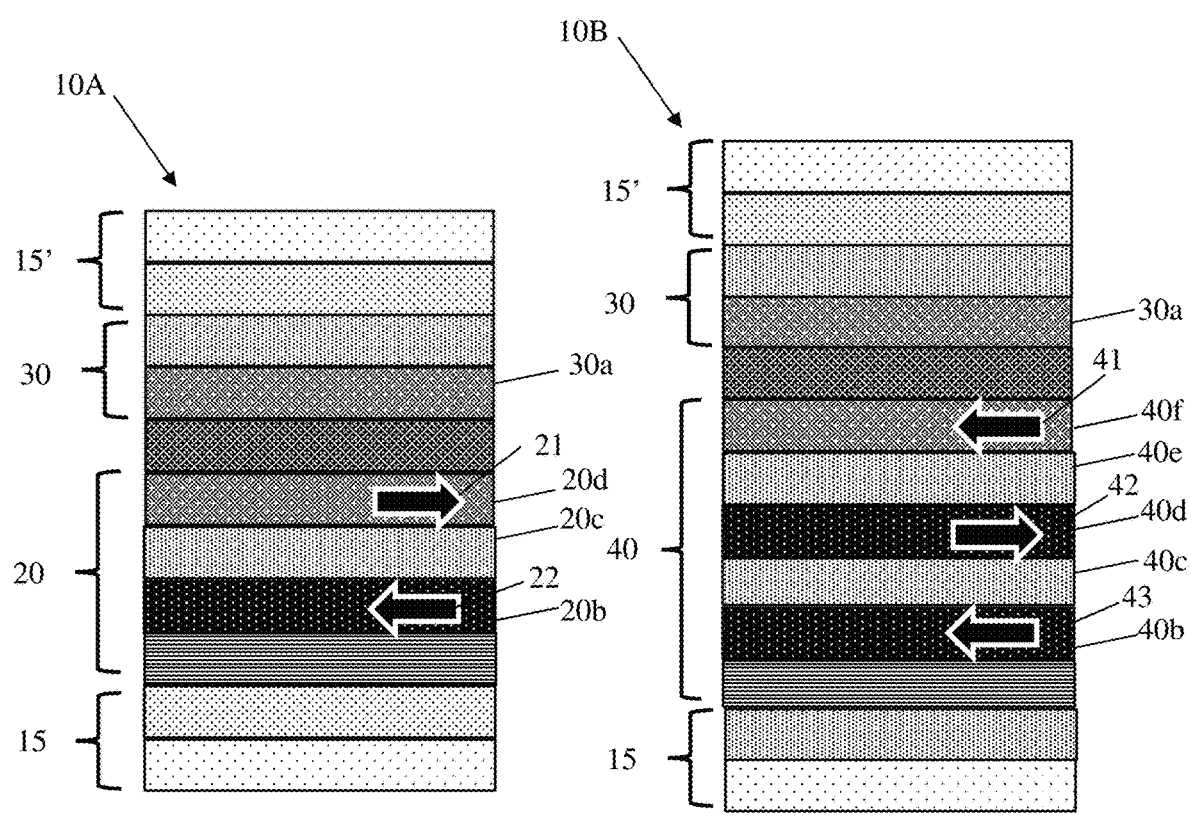
FIG. 2B shows a magnetization of certain materials of the first and second MTJ structures subsequent to the annealing process and no longer being subjected to a magnetic field.

In FIG. 2B, after the annealing process and the magnetic field is turned off, the magnetization of layer 20d in MTJ element 10A is flipped due to synthetic anti-ferromagnetic (SyAF) coupling as shown representatively by arrow 21. In particular, the magnetization of layer 20d can be flipped due to SyAF coupling because of the properties of layer 20c (i.e., the thickness of layer 20c, e.g., in a range of 7-10 Å). Similarly, the magnetization of layer 40d in MTJ structure 10B can be flipped (see arrow 42) due to SyAF coupling, e.g., because of properties of layer 40d (i.e., the thickness of layer 40e, e.g., in a range of 7-10 Å). Moreover, the magnetization of the layers 20b and 40b are fixed due to the anti-ferromagnetic (AFM)/ferromagnetic (FM) coupling between the layers 20b, 20a and, similarly, between the layers 40b, 40a, respectively (as described above with respect to FIG. 2A). Further, the magnetization of layer 40f can be fixed after annealing and the magnetic field is turned off. In embodiments, the annealing process can be slowly reduced to about 100° C., prior to ambient.

As should now be understood, in embodiments, the MTJ structures 10A, 10B include a tunnel barrier layer (e.g., the material 31 in FIGS. 2A and 2B), a free layer (e.g., material 30a in FIGS. 2A and 2B), and a fixed layer (e.g., material 20d in FIG. 2A and material 40d in FIG. 2B). The free layer and the fixed layer can be magnetic layers and the tunnel barrier layer can be a dielectric. In the MTJ structures 10A, 10B, the tunnel barrier layer is between the free layer and the fixed layer. If a magnetic field is applied to the MTJ elements, electrons that are spin polarized by the free layer and the fixed layer traverse the tunnel barrier layer through a tunneling process. Therefore, in embodiments, the MTJ structure 10A comprises a low electrical resistance when a magnetic moment of the free layer is parallel to the fixed layer and a high electrical resistance when the magnetic moment of the free layer is oriented anti-parallel to the fixed layer. And, the MTJ structure 10B comprises a high electrical resistance when the magnetic moment of the free layer is parallel to the fixed layer and the MTJ structure 10A has a low electrical resistance when the magnetic moment of the free layer is oriented anti-parallel to the fixed layer.

In embodiments, the MTJ structures 10A, 10B can be used to form a Wheatstone Bridge. The Wheatstone Bridge, accordingly, includes two types of magneto-resistive devices which exhibit opposite changes in electrical resistance to magnetic field changes. That is, the MTJ structure 10A has a different response to a magnetic field than MTJ structure 10B. In particular, as shown in the characteristic graphs 32, 42, the MTJ structure 10A has electrical resistance that decreases and the MTJ structure 10B has electrical resistance that increases as the magnetic field H increases. Therefore, while the electrical resistance of MTJ element 10B increases, the electrical resistance R of MTJ element 10A decreases, which are created by the two types of synthetic anti ferromagnetic (SAF) designs.

Figure 3A:
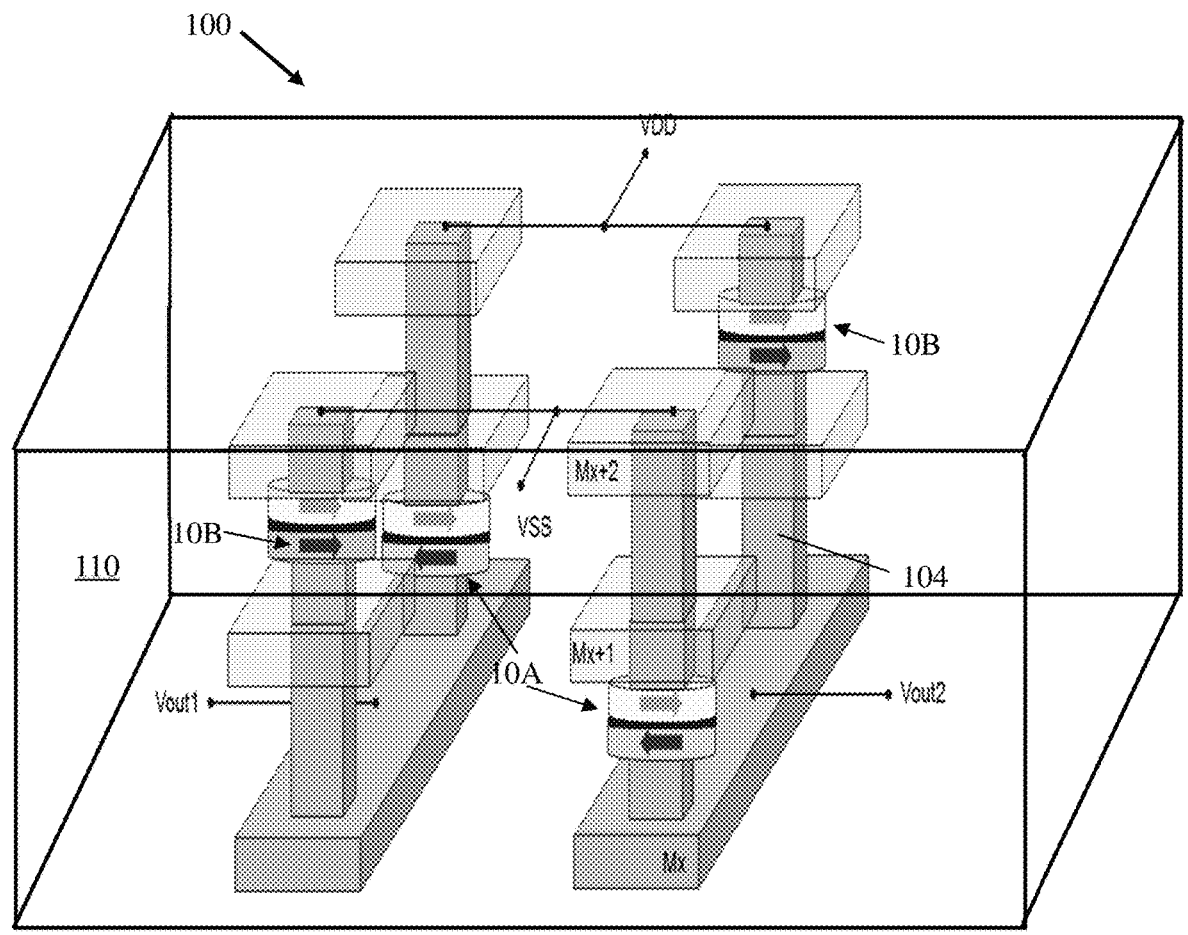
FIG. 3A shows a Wheatstone bridge structure, amongst other features, and respective fabrication processes in accordance with aspects of the present disclosure.
Figure 3B:
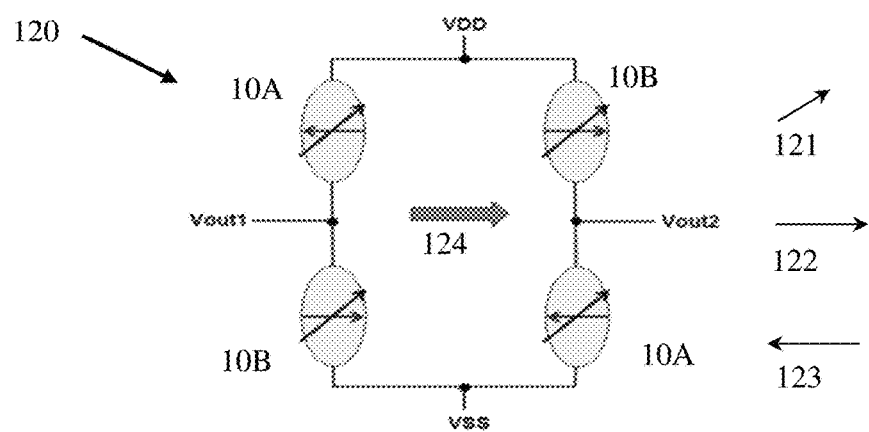
FIG. 3B shows a schematic of the Wheatstone bridge structure, amongst other features, and respective fabrication processes, in accordance with aspects of the present disclosure.

FIG. 3A shows a Wheatstone bridge structure in accordance with aspects of the present disclosure and FIG. 3B shows a representative electrical schematic of the Wheatstone bridge structure of FIG. 3A. The MTJ structures 10A, 10B comprising the Wheatstone bridge structure 100 can be a back end of the line (BEOL) structures. In particular, the Wheatstone bridge structure 100 can be formed using a standard complementary metal-oxide-semiconductor (CMOS) damascene processes.

In FIG. 3A, the Wheatstone bridge structure 100 includes different metal levels Mx, Mx+1 and Mx+2, with the MTJ structure 10A on metal level Mx+1 and the MTJ structure 10B on metal level Mx+2. In embodiments, the metal levels are connected by interconnect structures 104, and each of the structures are embedded within an insulator material 110. Accordingly, as shown in FIG. 3A, the two MTJ structures 10A, 10B are provided on different levels, connected through interconnect structures 104. In this representation, the MTJ structures 10A, 10B are vertically and laterally offset from one another; although other configurations on different metal levels are contemplated herein. As shown in FIG. 3A, a first voltage power supply VDD and a second voltage power supply VSS connect to the metal level Mx+2. Further, a first voltage output Vout1 and a second voltage output Vout2 connect to the metal level Mx.

FIG. 3B shows a schematic of the Wheatstone bridge structure of FIG. 3A. The schematic 120 shows that the MTJ structure 10A connects to the MTJ structure 10B through a first power supply VDD and a second power supply VSS. A first voltage output Vout1 connects between the MTJ structure 10A and the MTJ structure 10B. A second first voltage output Vout2 connects between the MTJ structure 10A and the MTJ structure 10B.

In FIG. 3B, the arrow 124 represents a magnetic field pointed to the right. Further, in the MTJ structures 10A, 10B, the free layer 121 (e.g., material 30a in FIGS. 2A and 2B) can be polarized in a parallel orientation; whereas, the fixed layers 122, 123 (e.g., material 20d in FIG. 2A and material 40d in FIG. 2B) of the MTJ structures 10A, 10B can have a magnetic field in either direction, e.g., a magnetic field to the right or to the left.

A tunnel magnetoresistance sensor (TMR) can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as Smartphones) and edge computing markets. SoC is also commonly used in embedded systems and the Internet of Things.

The structures and methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a first magnetic tunneling junction (MTJ) structure on a first device level; and
   a second magnetic tunneling junction (MTJ) structure on a different device level than the first MTJ structure, the second MTJ structure comprising properties different than the first MTJ structure,
   wherein the first MTJ structure is laterally and vertically offset from the second MTJ such that the second MTJ structure on the different device level is vertically higher than the first device level of the first MTJ structure and the second MTJ structure on the different device level is laterally offset in a horizontal plane from the first device level of the first MTJ structure.

2. The structure of claim 1, wherein the first MTJ structure comprises a lower electrical resistance in response to a magnetic field being increased to the first MTJ structure, and the second MTJ structure comprises a higher electrical resistance in response to the magnetic field being increased to the second MTJ structure.

3. The structure of claim 1, wherein the first MTJ structure comprises a bi-layer synthetic antiferromagnetic (SAF) and a first sensing layer, and the second MTJ structure comprises a tri-layer synthetic antiferromagnetic (SAF) and a second sensing layer.

4. The structure of claim 3, wherein the bi-layer SAF comprises any combination of Cobalt Iron, Cobalt Iron Boron, Cobalt Iron Boron Tantalum, Tantalum, Magnesium Oxide, Ruthenium, Molybdenum, Tungsten, Titanium, Zirconium, Hafnium, and Chromium.

5. The structure of claim 4, wherein the Cobalt Iron has a different magnetization direction than the Cobalt Iron Boron Tantalum.

6. The structure of claim 3, wherein the tri-layer SAF comprises any combination of a first layer of Cobalt Iron, and a second and third layer which comprises any combination of Cobalt Iron, Cobalt Iron Boron, Cobalt Iron Boron Tantalum, Tantalum, Ruthenium, Molybdenum, Tungsten, Titanium, Zirconium, Hydrogen Fluoride, and Chromium.

7. The structure of claim 6, wherein the second layer of Cobalt Iron has a different magnetization direction than the Cobalt Iron Boron Tantalum and the first layer of Cobalt Iron.

8. The structure of claim 1, wherein the first MTJ structure and the second MTJ structure each comprises a free layer and a fixed layer.

9. The structure of claim 8, wherein the free layer of the first MTJ structure and the second MTJ structure comprises any combination of Cobalt Iron Boron, Cobalt Iron Boron Tantalum, Tantalum, Molybdenum, Tungsten, Titanium, Zirconium, Hafnium, and Chromium.

10. The structure of 9, wherein the fixed layer of the first MTJ structure comprises any combination of Cobalt Iron Boron, Cobalt Iron Boron Tantalum, Tantalum, Molybdenum, Tungsten, Zirconium, Titanium, Hafnium, and Chromium, and the fixed layer of the second MTJ structure comprises Cobalt Iron.

11. The structure of claim 1, wherein the first MTJ structure and the second MTJ structure comprise a Wheatstone Bridge.

12. A structure, comprising:
    a first magnetic tunneling junction (MTJ) structure comprising a first layer synthetic anti ferromagnetic (SAF) on a first device level; and
    a second magnetic tunneling junction (MTJ) structure comprising a second layer synthetic anti ferromagnetic (SAF) on a second device level,
    wherein the first MTJ structure is laterally and vertically offset from the second MTJ such that the second MTJ structure on the second device level is vertically higher than the first device level of the first MTJ structure and the second MTJ structure on the second device level is laterally offset in a horizontal plane from the first device level of the first MTJ structure.

13. The structure of claim 12, wherein:
    the first MTJ structure comprises a lower electrical resistance in response to an increased magnetic field, and
    the second MTJ structure comprises a higher electrical resistance in response to the increased magnetic field.

14. The structure of claim 12, wherein the first MTJ structure and the second MTJ structure further comprise a sensing layer.

15. The structure of claim 12, wherein:
    the first layer SAF is a bi-layer SAF which comprises any combination of Cobalt Iron, Cobalt Iron Boron, Cobalt Iron Boron Tantalum, Tantalum, Ruthenium, Molybdenum, Tungsten, Titanium, Zirconium, Hafnium, and Chromium; and
    the second layer SAF is a tri-layer SAF comprises any combination of a first layer of Cobalt Iron, and a second and third layer of any combination of Cobalt Iron, Cobalt Iron Boron, Cobalt Iron Boron Tantalum, Tantalum, Ruthenium, Molybdenum, Tungsten, Titanium, Zirconium, Hydrogen Fluoride, and Chromium.

16. The structure of claim 15, wherein the Cobalt Iron in the bi-layer SAF comprises a different magnetization direction than the Cobalt Iron Boron Tantalum in the bi-layer SAF and the second layer of Cobalt Iron in the tri-layer SAF comprises the different magnetization direction than the Cobalt Iron Boron Tantalum and the first layer of Cobalt Iron in the tri-layer SAF.

17. The structure of claim 12, wherein:
    the first layer SAF is a tri-layer SAF which comprises any combination of a first layer of Cobalt Iron, and a second layer of any combination of Cobalt Iron, Cobalt Iron Boron, Cobalt Iron Boron Tantalum, Tantalum, Magnesium Oxide, Ruthenium, Molybdenum, Tungsten, Titanium, Zirconium, Hafnium, and Chromium; and
    the second layer SAF is a bi-layer SAF which comprises any combination of Cobalt Iron, Cobalt Iron Boron, Cobalt Iron Boron Tantalum, Tantalum, Magnesium Oxide, Ruthenium, Molybdenum, Tungsten, Titanium, Zirconium, Hafnium, and Chromium.

18. The structure of claim 12, wherein the first MTJ structure and the second MTJ structure comprise a Wheatstone bridge.

19. A method, comprising:
    forming a first magnetic tunneling junction (MTJ) on a first device level; and
    forming a second magnetic tunneling junction (MTJ) on a different device level than the first MTJ,
    wherein the second MTJ is laterally and vertically offset from the first MTJ such that the second MTJ on the different device level is vertically higher than the first device level of the first MTJ and the second MTJ on the different device level is laterally offset in a horizontal plane from the first device level of the first MTJ.

20. The structure of claim 1, wherein the first MTJ structure is connected to the second MTJ structure through a first power supply and a second power supply different from the first power supply.

* * * * *